US012616039B2

(12) United States Patent
Ng et al.

(10) Patent No.: US 12,616,039 B2
(45) Date of Patent: Apr. 28, 2026

(54) ELECTRONIC SYSTEM HAVING INTERMETALLIC CONNECTION STRUCTURE WITH CENTRAL INTERMETALLIC MESH STRUCTURE AND MESH-FREE EXTERIOR STRUCTURES

(71) Applicant: Infineon Technologies AG, Neubiberg (DE)

(72) Inventors: Chee Yang Ng, Muar (MY); Edmund Riedl, Wald (DE); Joseph Victor Soosai Prakasam, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 497 days.

(21) Appl. No.: 17/872,338

(22) Filed: Jul. 25, 2022

(65) Prior Publication Data
US 2023/0027669 A1    Jan. 26, 2023

(30) Foreign Application Priority Data
Jul. 26, 2021    (DE) ..................... 10 2021 119 288.9

(51) Int. Cl.
*H01L 23/00* (2006.01)
*H01L 23/495* (2006.01)

(52) U.S. Cl.
CPC ........ *H01L 24/32* (2013.01); *H01L 23/49568* (2013.01); *H01L 24/29* (2013.01);
(Continued)

(58) Field of Classification Search
CPC . H01L 2224/29339; H01L 2224/29211; H01L 2224/32503; H01L 2224/32507; H01L 2224/48245; H01L 2224/73265; H01L 2224/83204; H01L 2224/83815; H01L 23/36; H01L 23/49513; H01L 23/49562; H01L 23/49568; H01L 24/29; H01L 24/32; H01L 24/48; H01L 24/73; H01L 24/83; H01L 2924/3511; H01L 2924/35121; H01L 2224/29347; H01L 2224/32245; H01L 2224/165–16507
See application file for complete search history.

(56) References Cited

U.S. PATENT DOCUMENTS

| | | |
|---|---|---|
| 8,742,600 B2 | 6/2014 | Chang et al. |
| 8,896,119 B2 | 11/2014 | Sakamoto et al. |
| (Continued) | | |

FOREIGN PATENT DOCUMENTS

| | | |
|---|---|---|
| DE | 10 2015 114 874 | 3/2016 |
| DE | 11 2015 003 845 | 5/2017 |
| WO | 2018/193760 | 10/2018 |

*Primary Examiner* — Julio J Maldonado
*Assistant Examiner* — Stanetta D Isaac
(74) *Attorney, Agent, or Firm* — Dicke, Billig & Czaja, PLLC

(57) ABSTRACT

An electronic system is disclosed. In one example, the electronic system comprises an at least partially electrically conductive carrier, an electronic component, and an intermetallic connection structure connecting the carrier and the component. The intermetallic connection structure comprising an intermetallic mesh structure in a central portion of the intermetallic connection structure, and opposing exterior structures without intermetallic mesh and each arranged between the intermetallic mesh structure and the carrier or the component.

18 Claims, 5 Drawing Sheets

(52) U.S. Cl.
CPC .............. *H01L 24/83* (2013.01); *H01L 24/48* (2013.01); *H01L 24/73* (2013.01); *H01L 2224/29211* (2013.01); *H01L 2224/29339* (2013.01); *H01L 2224/29347* (2013.01); *H01L 2224/32245* (2013.01); *H01L 2224/32503* (2013.01); *H01L 2224/32507* (2013.01); *H01L 2224/48245* (2013.01); *H01L 2224/73265* (2013.01); *H01L 2224/83204* (2013.01); *H01L 2224/83815* (2013.01); *H01L 2924/3511* (2013.01); *H01L 2924/35121* (2013.01)

(56) References Cited

U.S. PATENT DOCUMENTS

| | | | |
|---|---|---|---|
| 9,536,851 B2 | 1/2017 | Kroener | |
| 2004/0108367 A1 | 6/2004 | Farooq et al. | |
| 2006/0061974 A1 | 3/2006 | Soga et al. | |
| 2010/0155115 A1 | 6/2010 | Pang et al. | |
| 2012/0001336 A1* | 1/2012 | Zeng ....................... | H01L 24/45 257/769 |
| 2014/0097534 A1* | 4/2014 | Chang .................... | H01L 24/32 257/737 |
| 2017/0232562 A1 | 8/2017 | Maeno | |
| 2018/0358318 A1 | 12/2018 | Shearer et al. | |
| 2019/0366486 A1 | 12/2019 | Zhang et al. | |
| 2020/0235033 A1 | 7/2020 | Lee et al. | |
| 2021/0183804 A1 | 6/2021 | Heinrich et al. | |
| 2021/0225795 A1 | 7/2021 | Otremba et al. | |

* cited by examiner

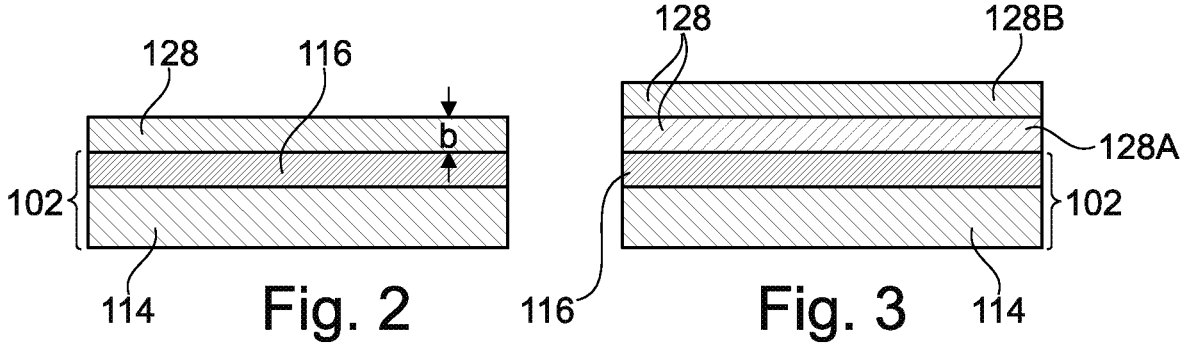
Fig. 2
Fig. 3
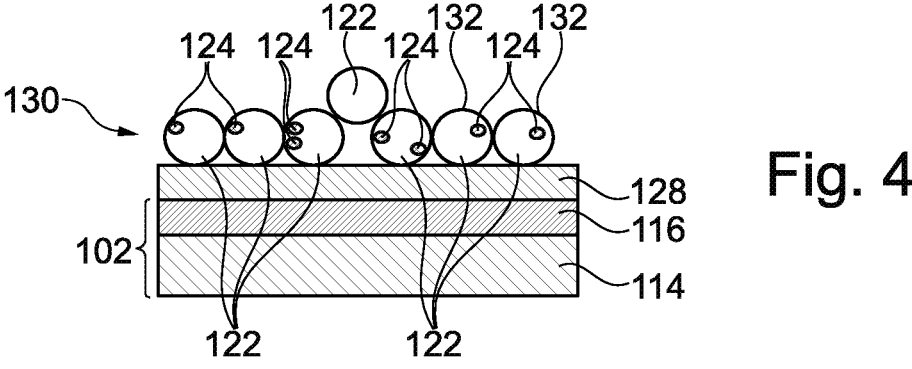
Fig. 4
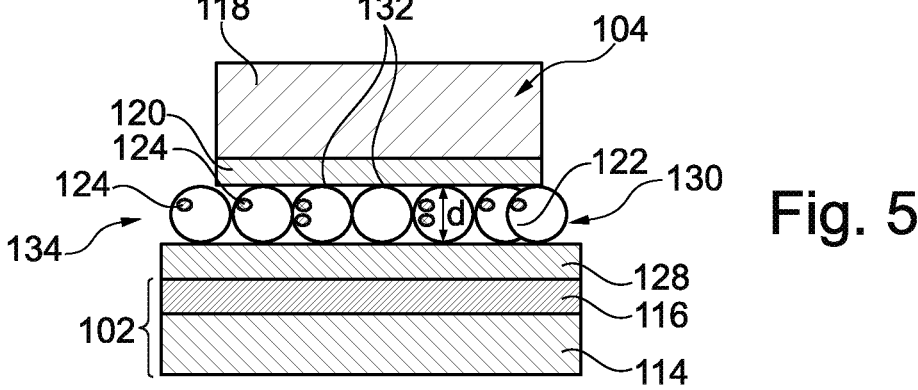
Fig. 5
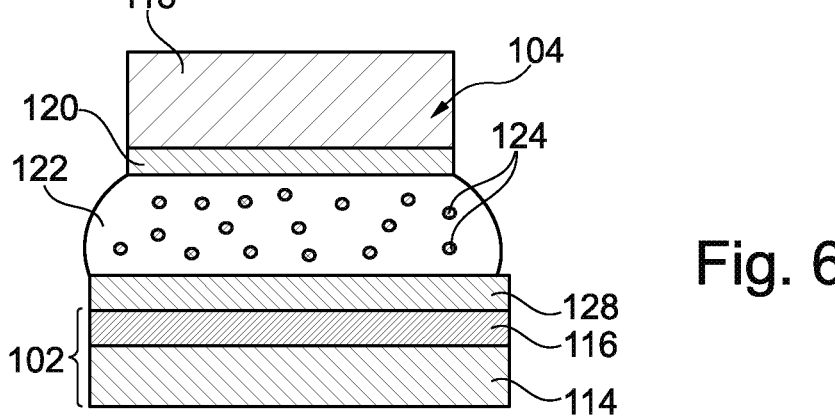
Fig. 6

ELECTRONIC SYSTEM HAVING INTERMETALLIC CONNECTION STRUCTURE WITH CENTRAL INTERMETALLIC MESH STRUCTURE AND MESH-FREE EXTERIOR STRUCTURES

CROSS-REFERENCE TO RELATED APPLICATION

This Utility Patent application claims priority to German Patent Application No. 10 2021 119 288.9, filed Jul. 26, 2021, which is incorporated herein by reference.

BACKGROUND

Technical Field

Various embodiments relate generally to an electronic system, and a method of manufacturing an electronic system.

Description of the Related Art

A conventional electronic system may comprise an electronic component soldered on a chip carrier such as a leadframe, and may be optionally molded using a mold compound as an encapsulant.

SUMMARY

There may be a need to connect an electronic component with a conductive carrier in an electronic system with a high reliability.

According to an exemplary embodiment, an electronic system is provided which comprises an at least partially electrically conductive carrier, an electronic component, and an intermetallic connection structure connecting the carrier and the component and comprising an intermetallic mesh structure in a central portion of the intermetallic connection structure, and opposing exterior structures without intermetallic mesh and each arranged between, on the one hand, the intermetallic mesh structure and, on the other hand, the carrier or the component.

According to another exemplary embodiment, a method of manufacturing an electronic system is provided, wherein the method comprises connecting an at least partially electrically conductive carrier with an electronic component by an intermetallic connection structure, and forming the intermetallic connection structure with an intermetallic mesh structure in a central portion of the intermetallic connection structure, and opposing exterior structures without intermetallic mesh and each arranged between, on the one hand, the intermetallic mesh structure and, on the other hand, the carrier or the component.

According to an exemplary embodiment, an electrically conductive carrier (such as a leadframe) and an electronic component (for example a semiconductor die) are connected with each other in an electronic system (such as a package or module) by an intermetallic connection structure (in particular by soldering). Advantageously, said intermetallic connection structure may comprise a central intermetallic mesh structure—in which different metals form a continuous network—and may comprise peripheral or exterior structures which do not have a continuous network in form of an intermetallic mesh. Descriptively speaking, the intermetallic mesh structure may form a mechanically strong high temperature stable backbone maintaining integrity of the solder-type intermetallic connection structure, thereby preventing delamination inside of the electronic system. A first exterior structure without intermetallic mesh may be located between the intermetallic mesh structure and the carrier, whereas a second exterior structure without intermetallic mesh may be located between the intermetallic mesh structure and the component. Advantageously, the intermetallic mesh may form a highly reliable mechanical and/or electrical connection between carrier and component capable of withstanding high thermal and mechanical load without the risk of cracks or separation. Undesired remelting of the intermetallic connection structure in the event of a later temperature increase may be reliably prevented. Advantageously, a top-to-bottom connection between component and carrier may be achieved which significantly improves reliability of the obtained electronic system as compared to conventional connection structures. Descriptively speaking, the exterior structures may be a fingerprint of metallic structures on and between carrier and component before interconnection and may advantageously smoothen a transition between carrier and component. This may avoid an abrupt material interface between intermetallic mesh on the one hand and carrier and component on the other hand.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 2 to FIG. 8 are cross-sectional views of structures obtained during manufacturing an electronic system, as the one shown in FIG. 1, according to an exemplary embodiment.

FIG. 9 illustrates a cross-sectional view of an electronic system according to another exemplary embodiment.

FIG. 10 illustrates a cross-sectional view of an electronic system according to still another exemplary embodiment.

DETAILED DESCRIPTION

Figure 1:
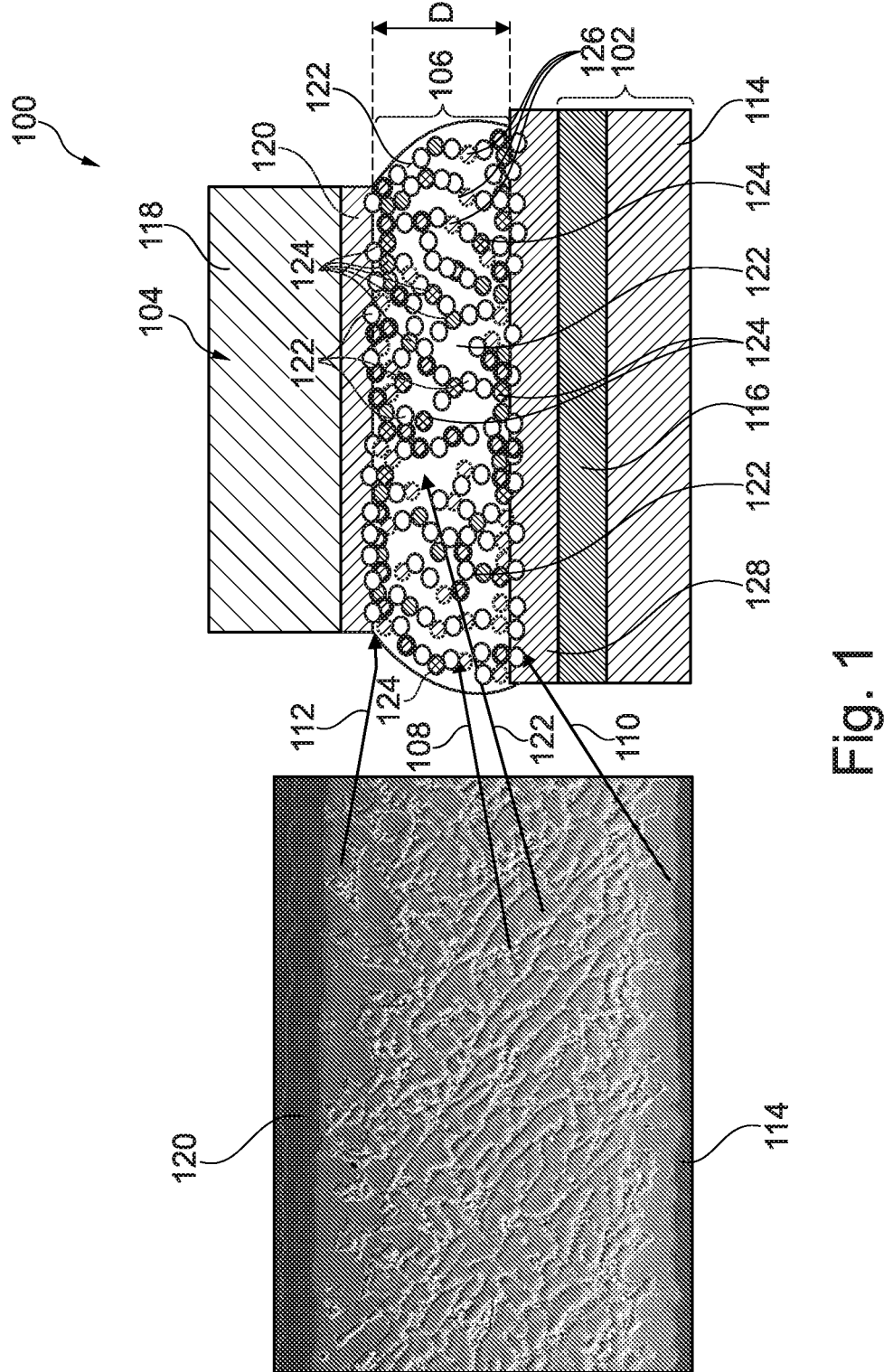
FIG. 1 illustrates a cross-sectional schematic view of an electronic system according to an exemplary embodiment and a cross-sectional view of a manufactured electronic system according to an exemplary embodiment.

There may be a need to connect an electronic component with a conductive carrier in an electronic system with a high reliability.

According to an exemplary embodiment, an electronic system is provided which comprises an at least partially electrically conductive carrier, an electronic component, and an intermetallic connection structure connecting the carrier and the component and comprising an intermetallic mesh structure in a central portion of the intermetallic connection structure, and opposing exterior structures without intermetallic mesh and each arranged between, on the one hand, the intermetallic mesh structure and, on the other hand, the carrier or the component.

According to another exemplary embodiment, a method of manufacturing an electronic system is provided, wherein the method comprises connecting an at least partially electrically conductive carrier with an electronic component by an intermetallic connection structure, and forming the intermetallic connection structure with an intermetallic mesh structure in a central portion of the intermetallic connection structure, and opposing exterior structures without intermetallic mesh and each arranged between, on the one hand, the intermetallic mesh structure and, on the other hand, the carrier or the component.

According to an exemplary embodiment, an electrically conductive carrier (such as a leadframe) and an electronic component (for example a semiconductor die) are connected with each other in an electronic system (such as a package or module) by an intermetallic connection structure (in particular by soldering). Advantageously, said intermetallic connection structure may comprise a central intermetallic mesh structure—in which different metals form a continuous network—and may comprise peripheral or exterior structures which do not have a continuous network in form of an intermetallic mesh. Descriptively speaking, the intermetallic mesh structure may form a mechanically strong high temperature stable backbone maintaining integrity of the solder-type intermetallic connection structure, thereby preventing delamination inside of the electronic system. A first exterior structure without intermetallic mesh may be located between the intermetallic mesh structure and the carrier, whereas a second exterior structure without intermetallic mesh may be located between the intermetallic mesh structure and the component. Advantageously, the intermetallic mesh may form a highly reliable mechanical and/or electrical connection between carrier and component capable of withstanding high thermal and mechanical load without the risk of cracks or separation. Undesired remelting of the intermetallic connection structure in the event of a later temperature increase may be reliably prevented. Advantageously, a top-to-bottom connection between component and carrier may be achieved which significantly improves reliability of the obtained electronic system as compared to conventional connection structures. Descriptively speaking, the exterior structures may be a fingerprint of metallic structures on and between carrier and component before interconnection and may advantageously smoothen a transition between carrier and component. This may avoid an abrupt material interface between intermetallic mesh on the one hand and carrier and component on the other hand.

DESCRIPTION OF FURTHER EXEMPLARY EMBODIMENTS

In the following, further exemplary embodiments of the method and the electronic system will be explained.

In the context of the present application, the term "electronic system" may particularly denote an electronic device comprising one or more electronic components, optionally using an encapsulant. Furthermore, a carrier for the electronic component(s) may be implemented in an electronic system. For instance, such an electronic system may be a module or a package.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). However, in other embodiments, the electronic component may also be of different type, such as a mechatronic member, in particular a mechanical switch, etc.

In the context of the present application, the term "intermetallic connection structure" may particularly denote a medium reliably connecting component and carrier and comprising a plurality of different metallic constituents.

In the context of the present application, the term "intermetallic mesh structure" may particularly denote a network of metallic structures of different metallic materials in a metallic matrix, the network forming a continuous connection between opposing metallic exterior structures (the latter being provided without such a network). An intermetallic mesh structure may comprise fibers or filaments, which may be composed of connected metallic particles of different metallic materials. For instance, such fibers or filaments may be merged or interconnected.

In the context of the present application, the term "exterior structures without intermetallic mesh" may particularly denote a metallic structure connecting an intermetallic mesh structure with an electronic component or with a conductive carrier and being free of a continuous network of different metals. The exterior structures may be intermetallic structures, but no uninterrupted network of different metallic constituents is formed in the exterior structures establishing an uninterrupted vertical connection. The exterior structures may also comprise different metallic materials which however do not create a continuous vertical connection in form of a mesh or network. In contrast to this, the exterior structures may comprise a matrix metal in which individual metallic islands and/or short intermetallic fragments may be embedded not forming a continuous vertical connection through the matrix metal. The exterior structures without intermetallic mesh may also provide a mechanical and/or electrically conductive connection without continuous vertical intermetallic network and may be a fingerprint of a manufacturing process, such as the one according to FIG. 1 to FIG. 8.

In an embodiment, the carrier comprises a leadframe structure (for instance made of copper). Hence, the carrier may be embodied as patterned metal plate and thus in a simple and easily processable way.

However, the carrier may be alternatively embodied in another way, for instance as a central electrically insulating and thermally conductive sheet (for instance made of a ceramic), covered on one or both opposing main surfaces thereof with an electrically conductive layer (such as a copper or aluminum layer). For example, a carrier may be embodied as a DAB (Direct Aluminum Bonding), DCB (Direct Copper Bonding) substrate, etc. Furthermore, the carrier may also be configured as Active Metal Brazing (AMB) substrate.

In an embodiment, the carrier comprises an electrically conductive main body (for instance made of copper or aluminum) which is partially covered by a metallic diffusion barrier. For instance, a surface of the main body or part thereof may be covered with a metallic diffusion layer made of nickel. This may suppress excessive diffusion of material from the main body into the intermetallic connection structure.

In an embodiment, the component comprises a semiconductor body covered with a backside metallization, said backside metallization being connected to the intermetallic connection structure. For instance, the semiconductor body may be made of silicon. At least one monolithically integrated circuit element may be formed in the semiconductor body, for instance a transistor structure and/or a diode structure. For example, an active surface of the semiconductor body in which at least one integrated circuit element is monolithically integrated may oppose another surface of the semiconductor body on which a backside metallization is applied.

In an embodiment, the intermetallic connection structure comprises a solder matrix for creating a solder connection between the component and the carrier. For instance, the solder matrix may be made of a solderable material (preferably tin) having a melting temperature below a melting temperature of each other metallic element of the intermetallic mesh structure. During a reflow process, selectively only the material of the solder matrix may melt or may become liquid or flowable, whereas different metallic materials of the intermetallic mesh structure, which may be formed during such a reflow process, may remain solid particles and may therefore dissolve in the flowable solder matrix. This offers an excellent basis for the formation of the intermetallic mesh structure—with high melting point—within the solder matrix—with lower melting point-resulting in an intermetallic connection structure being reliably protected against undesired re-melting after its formation.

In an embodiment, the solder matrix comprises tin. Other solderable materials are possible as well.

In an embodiment, the intermetallic connection structure comprises intermetallic phase promoter particles (which can be macroscopic or microscopic particles, or even particles at atomic level) of at least one intermetallic phase promoter metal for promoting formation of an intermetallic phase within the intermetallic connection structure. Such intermetallic phase promoter particles may promote formation of the intermetallic mesh structure and may be included in a solder paste applied between carrier and electronic component during manufacture of the electronic system. For instance, the at least one intermetallic phase promoter metal comprises silver and and/or copper. Such materials may have a higher melting point compared with a solder matrix (for instance of tin) of the intermetallic connection structure, and may be capable of forming an intermetallic phase with other metals in a flowable solder medium.

In an embodiment, the intermetallic connection structure comprises intermetallic phase acceleration particles of at least one intermetallic phase acceleration metal for accelerating formation of the intermetallic mesh structure. The intermetallic phase acceleration particles may be provided by a dedicated layer provided on top of the carrier, and/or may be provided in form of particles being embedded in a solder matrix of a solder paste applied between carrier and component during manufacture of the electronic system. Such an intermetallic phase acceleration material may speed up, trigger or even catalyze formation of an intermetallic mesh structure in a temporarily flowable solder matrix and may contribute to the formation of an intermetallic layer connecting the chip and carrier surface together. For instance, the at least one intermetallic phase acceleration metal may comprise palladium, gold, platinum, and/or zinc. However, an intermetallic phase acceleration metal may also be a metal from a wafer back side (i.e. a backside metallization of the electronic component), for instance vanadium.

In an embodiment, the intermetallic connection structure is free of lead (Pb). Highly advantageously, this may prevent biohazardous properties of the intermetallic connection structure. Consequently, an environmentally friendly electronic system may be formed by avoiding lead in the intermetallic connection structure.

In an embodiment, a vertical thickness of the intermetallic connection structure is in a range from 5 μm to 50 μm, in particular in a range from 10 μm to 30 μm, more particularly in a range from 10 μm to 20 μm. Advantageously, the described intermetallic connection structure or bond line may be provided with a very low thickness. This keeps the electronic system compact in a vertical direction and ensures a high mechanical, thermal and electrical reliability of the electronic system.

In an embodiment, the electronic system comprises an intermetallic phase acceleration layer of at least one intermetallic phase acceleration metal for accelerating formation of the intermetallic mesh structure and being arranged between the carrier and the intermetallic connection structure. During manufacture, said intermetallic phase acceleration layer may function as a reservoir for intermetallic phase acceleration particles dissolving in a temporarily flowable solder matrix. Together with intermetallic phase promoter particles in the solder matrix, the intermetallic phase acceleration particles are constituents of the intermetallic mesh structure of high melting point formed in a lower melting point solder matrix of the intermetallic connection structure.

In an embodiment, the intermetallic phase acceleration layer is a single layer (see for instance FIG. 2) or a double layer (see for instance FIG. 3). A single layer may be formed with low effort, whereas a double layer allows to fine-tune the properties of the intermetallic phase acceleration layer.

In an embodiment, a partial vertical thickness of the intermetallic mesh structure in relation to the entire intermetallic phase structure is at least 80%, in particular at least 90%. Hence, the vast majority of the vertical thickness of the intermetallic phase structure may be contributed by the intermetallic mesh structure. Thus, the reinforcing and anti-remelting function of the intermetallic mesh or network may be provided over a significant sub-range of the entire intermetallic connection structure.

In an embodiment, the intermetallic mesh structure forms a bifurcated network of interconnected multi-metal particles extending continuously between an entire vertical spacing between the exterior structures. Thus, the intermetallic mesh structure may be constituted of a plurality of interconnected filaments or fibers, each formed by a sequence of directly connected metallic particles of at least two different metallic chemical elements, preferably of at least three different metallic chemical elements, for instance of three, four or five different metallic chemical elements. The various intermetallic filaments or fibers of the intermetallic mesh structure may comprise one or more merging and/or crossing points and may cover an entire vertical range between the two opposing exterior structures of the intermetallic connection structure.

In an embodiment, a weight percentage of the intermetallic mesh structure in relation to the entire intermetallic connection structure is in a range from 1 weight percent to 30 weight percent, in particular in a range from 3 weight percent to 8 weight percent, more particularly in a range from 4.5 weight percent to 6.5 weight percent. Preferably, a relatively small partial weight is contributed by the intermetallic mesh structure. This may ensure a proper flowability of the intermetallic connection structure during reflow soldering (thanks to the solder matrix), while simultaneously ensuring that no remelting may occur after completing the solder process. Relatively smooth properties of the solder matrix, which may have the highest material contribution in the intermetallic connection structure, may also function as a mechanical buffer in the electronic system.

In an embodiment, the method comprises forming the intermetallic connection structure by applying a solder paste on the carrier, the solder paste comprising a solder matrix for creating a solder connection between the component and the carrier, and intermetallic phase promoter particles of at least one intermetallic phase promoter metal for promoting formation of an intermetallic phase within the intermetallic connection structure. Optionally, it may also be possible to add intermetallic phase accelerator particles to the solder matrix. Additionally on alternatively, intermetallic phase accelerator material may be provided in form of a plating layer on the carrier below the solder paste. Hence, the method may comprise covering the carrier with an intermetallic phase acceleration layer for accelerating formation of the intermetallic mesh structure, and arranging the intermetallic phase acceleration layer between the carrier and the solder paste. Additionally or alternatively, the method may comprise providing the solder paste with intermetallic phase acceleration particles for accelerating formation of the intermetallic mesh structure.

In an embodiment, the method comprises providing the solder paste with intermetallic particles having a diameter in a range from 5 μm to 50 μm, in particular in a range from 10 μm to 20 μm. This keeps the thickness of a bond line, being formed during the soldering process, small.

In an embodiment, the method comprises pressing the solder paste between the carrier and the component. Advantageously, such a pressing process may apply sufficient mechanical pressure to the solder paste in order to form a monolayer of intermetallic particles of the solder paste between the carrier and the component. In other words, only single solder paste particles bridge the carrier and the component after this pressing process. This ensures a small bond line or thickness of the manufactured intermetallic connection structure.

In an embodiment, the method comprises forming the intermetallic connection structure by heating precursors of the intermetallic connection structure (in particular a solder paste, comprising a solder matrix and intermetallic phase promoter particles and optionally intermetallic phase acceleration particles, or one or more intermetallic phase acceleration layers below the solder paste) to a peak temperature above a melting temperature of a solder precursor (i.e. the solder matrix) and below a melting temperature of intermetallic mesh precursors (i.e. the intermetallic phase promoter and acceleration particles and/or layer(s)). By this heating process, the solder matrix becomes flowable, whereas the intermetallic phase promoter and acceleration particles and/or layer(s) remain in a solid state and may be dissolved in the flowable solder matrix. The formation of this mixture in combination with an appropriate temperature profile triggers formation of the intermetallic mesh structure in a solder matrix. After re-solidification of the solder matrix, the intermetallic connection structure as a whole is reliably protected against undesired remelting, since this may be suppressed by the intermetallic mesh structure.

In an embodiment, the method comprises maintaining the peak temperature for a time interval of at least 1 minute, in particular for a time interval in a range from 1 minute to 4 minutes, more particularly for a time interval in a range from 1.5 minutes to 2 minutes. Highly advantageously, the described mixture may be maintained in a partially flowable stage for a relatively long time interval. This may give the mixture sufficient time to form an intermetallic mesh structure extending along the whole vertical spacing between two opposing exterior structures without intermetallic mesh.

In an embodiment, the peak temperature is in a range from 260° C. to 350° C., in particular in a range from 280° C. to 300° C. For comparison, the melting temperature of the solder precursor may be below 240° C. Furthermore, the melting temperature of the intermetallic mesh precursors may be at least 370° C. As a result of this processing, selectively the solder matrix becomes flowable, whereas the metallic particles forming the intermetallic mesh structure are not melted during soldering.

In an embodiment, the method comprises forming the intermetallic connection structure by reflow soldering. Reflow soldering may denote a process in which a solder paste (in particular a sticky mixture of solderable particles and flux, additionally enriched by precursors for forming the intermetallic mesh structure) is used to temporarily attach one or multiple electronic components to the carrier, after which the entire assembly is subjected to controlled heat. The solder paste, but not the precursors for forming the intermetallic mesh structure, reflows in a molten state, creating permanent solder joints. Heating may be accomplished, for example, by passing the assembly through a reflow oven, for example under an infrared lamp.

In an embodiment, the mesh structure and the exterior structures comprise the same intermetallic materials. Although the concentrations of the various intermetallic materials may be different in the mesh structure and in the two opposing exterior structures, the origin of the various metals in the mesh structure and in the exterior structures may be the same as a consequence of the described manufacturing process. For instance, a lower exterior structure may comprise one or more metallic materials of an intermetallic phase acceleration layer sandwiched between the carrier and the solder matrix, and particles of the solder matrix. For example, an upper exterior structure may comprise a metallic material of a back side metallization layer sandwiched between the semiconductor body of the electronic component and the solder matrix, and particles of the solder matrix. The intermetallic mesh structure may comprise particles of the solder matrix, one or more metallic materials of an intermetallic phase acceleration layer sandwiched between the carrier and the solder matrix, one or more metallic materials of intermetallic phase promoter particles, and particles of a back side metallization layer sandwiched between the semiconductor body of the electronic component and the solder matrix.

In an embodiment, the electronic system comprises an encapsulant at least partially encapsulating at least one of the at least one electronic component, the carrier, and the intermetallic connection structure. In the context of the present application, the term "encapsulant" may particularly denote a substantially electrically insulating and preferably thermally conductive material surrounding at least part of a component and at least part of a carrier, as well as a part of the intermetallic connection structure. For instance, the encapsulant may be a mold compound and may be created for example by transfer molding. Alternatively, the encapsulant may be a casting compound formed by casting.

In an embodiment, at least one of the at least one electronic component is a bare die. By embodying the at least one electronic component as a non-encapsulated chip, i.e. a pure semiconductor chip without additional dielectric encapsulant, the compactness of the electronic system may be further enhanced.

In an embodiment, the electronic system comprises a plurality of (in particular electronic) components mounted on the carrier or on different carriers. Thus, the electronic system may comprise one or more electronic components (for instance at least one passive component, such as a capacitor, and at least one active component, such as a semiconductor chip).

In an embodiment, the electronic device comprises a mounting base (such as a printed circuit board, PCB) on which the arrangement of carrier and electronic component is mounted and being electrically coupled with the electronic component and/or with the carrier. Such a mounting base may be an electronic board serving as mechanical base for the electronic system, for instance embodied as package.

In an embodiment, the electronic system is configured as one of the group consisting of a leadframe connected power module, a Transistor Outline (TO) electronic system, a Quad Flat No Leads Electronic system (QFN) electronic system, a Small Outline (SO) electronic system, a Small Outline Transistor (SOT) electronic system, and a Thin Small Outline Electronic system (TSOP) electronic system. Also electronic systems for sensors and/or mechatronic devices are possible embodiments. Moreover, exemplary embodiments may also relate to electronic systems functioning as nano-batteries or nano-fuel cells or other devices with chemical, mechanical, optical and/or magnetic actuators. Therefore, the electronic system according to an exemplary embodiment is fully compatible with standard packaging concepts (in particular fully compatible with standard TO packaging concepts).

In an embodiment, the electronic system is configured as power module, for instance molded power module. For instance, an exemplary embodiment of the electronic system may be an intelligent power module (IPM). Another exemplary embodiment of the electronic system is a dual inline electronic system (DIP).

In an embodiment, the electronic component is configured as a power semiconductor chip. Thus, the electronic component (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide). A semiconductor power chip may comprise one or more field effect transistors, diodes, inverter circuits, half-bridges, full-bridges, drivers, logic circuits, further devices, etc.

As substrate or wafer forming the basis of the electronic components, a semiconductor substrate, in particular a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

According to exemplary embodiments, an electronic system with a joint material in form of an intermetallic connection structure between an electronic component (such as a die with back side metallization) and a conductive carrier (for example a leadframe) with excellent connection properties may be provided. Said intermetallic connection structure may be formed with an intermetallic mesh in the middle (preferably embedded in a matrix of solder material with lower melting temperature than the intermetallic mesh), and layers without mesh on the boundaries on top and on bottom (i.e. facing the component and the carrier, respectively). This may allow to obtain a non-remelting reinforced solder structure reliably connecting component and carrier and being stable even up to high temperatures. Since the mentioned intermetallic connection structure may be formed without lead (Pb) material, the interconnection may be achieved without biohazard properties and without issues in terms of pollution.

Hence, an exemplary embodiment provides a non-remelting leadfree soldering structure in form of the intermetallic connection structure. Thus, an exemplary embodiment provides a method enabling to create a common low melting point leadfree solder having advantageously non-remelting properties thanks to the formation of an intermetallic mesh. More specifically, an exemplary embodiment provides a common leadfree solder structure having a vertically fused intermetallic compound mesh withstanding even a high reflow temperature without remelting. It is believed that this property can be achieved and promoted in particular by the intermetallic mesh extending across a bond line. Advantageously, such a solder bond line may remain intact during reflow even with partial or localized remelting. Such an intermetallic connection structure may be formed using dopants which may be provided by plating on a carrier in a solder system. Advantageously, fine solder balls may be used to bring down the bond line after die bonding, thereby enhancing formation of a vertical intermetallic mesh. Hence, a leadfree solder replacement may be obtained without undesired remelting properties.

A gist of an exemplary embodiment is thus the provision of a connection system enabling a common low melting point leadfree solder which does not non-remelt after reflow thanks to the creation of an intermetallic compound mesh. Hence, an intermetallic compound mesh may be formed in an intermetallic connection structure across a bond line which can withstand reflow temperature without remelting, thereby improving reliability of the obtained electronic system. In particular, a corresponding intermetallic connection structure may be able to hold the solder bond line intact during reflow even with partial or spatially localized remelting.

In order to manufacture such an intermetallic connection structure, it may be possible to provide a fine solder paste for a low bond line before a reflow process. Hence, such a low bond line may be created prior to a reflow process, wherein the bond line thickness may be not more than 40 μm (for example, a type 5 solder paste may be used for this purpose, in which a nominal solder ball size may have dimensions in a range from 20 μm to 25 μm).

Moreover, one or more dopants may be provided in form of one or more carrier plating layers: Such a dopant system may comprise (i) one or more elements with high solubility (in particular high dispersion) in solders (such as gold (Au), palladium (Pd), etc.) which contribute to form a uniform intermetallic compound mesh across a bond line, and (ii) one or more elements which enhance a solder joint reliability (for instance zinc (Zn), nickel (Ni), etc.).

What concerns a reflow profile applied during manufacture of an electronic system according to an exemplary embodiment, a maximum peak temperature may be around an organic carrier glass transition temperature (Tg, which may be typically in a range from 260° C. to 350° C., to manage warpage), and a liquidus duration (which may be in a range from 1 min to 2 min) being sufficient for a formation of an intermetallic compound mesh. As a result, a vertically joined intermetallic compound mesh with a network of different metals may be formed, which may also be denoted as intermetallic mesh structure in an intermetallic connection structure. At an upper and at a lower periphery of said intermetallic connection structure, a respective exterior structure may be formed without intermetallic mesh.

More specifically, said intermetallic mesh structure (or mesh intermetallic compound) may have a complex mix of different intermetallic compound species, such as: (i) $Ag_3Sn$; (ii) $Cu_3Sn$; and/or (iii) Pd and Au intermetallic mesh compound species in the lower ppm range.

When such an intermetallic compound mesh is formed, a copper content in the bulk solder may become very low: This may indicate pulling of elements to form the intermetallic compound mesh.

In an embodiment, a bulk solder—which may also form a matrix of the intermetallic connection structure—may be mainly tin (Sn). At the same time, the content of Sn in the mesh intermetallic compound and in the bulk solder may be both high. This may indicate a capture of Sn for the intermetallic compound formation, which may leave behind a lower content of free Sn, which may be a conventional cause of remelting in an overall solder joint.

According to exemplary embodiments, additional metallic dopants (such as nickel and/or palladium) may help in terms of the intermetallic compound mesh formation. Printing or dispensing a thin solder may be sufficient to cover a die area.

Advantageously, a bond line thickness before a reflow process may be in a range from 25 μm to 50 μm, and after the reflow process in a range from 10 μm to 30 μm.

FIG. 1 illustrates a cross-sectional schematic view of an electronic system 100 according to an exemplary embodiment and a cross-sectional view of a manufactured electronic system 100 according to an exemplary embodiment. On the left-hand side of FIG. 1, an experimentally manufactured electronic system 100 is shown, whereas the right-hand side of FIG. 1 shows a schematic illustration of such an electronic system 100. The electronic system 100 may be configured as a semiconductor package or module.

On its bottom side, the electronic system 100 may comprise an electrically conductive carrier 102, such as a leadframe (for example a patterned copper plate). More specifically, the carrier 102 comprises an electrically conductive main body 114, which may for instance be made of copper, and which may be covered by a metallic diffusion barrier 116, for example a layer made of nickel. Descriptively speaking, the metallic diffusion barrier 116 inhibits or even eliminates diffusion of metallic material of the main body 114 into a below described intermetallic phase acceleration layer 128.

Furthermore, an electronic component 104, which may be embodied as a semiconductor die, may form an upper part of the electronic system 100. In the shown embodiment, the component 104 comprises a semiconductor body 118 (for instance made of silicon, and having at least one monolithically integrated circuit element therein, not shown). The semiconductor body 118 is covered with a backside metallization 120, for instance a layer made of copper, which is connected to an intermetallic connection structure 106.

As shown as well in FIG. 1, said electrically conductive solder-type intermetallic connection structure 106 is arranged vertically between the carrier 102 and the component 104 for mechanically and electrically interconnecting the carrier 102 and the component 104. The intermetallic connection structure 106 comprises an intermetallic mesh structure 108 in a central portion of the intermetallic connection structure 106. The intermetallic mesh structure 108 can be considered as a network of different metallic particles forming continuous electrically conductive paths in the vertical direction and being embedded in a metallic matrix of another metallic material. As shown as well in FIG. 1, a lower exterior structure 110 is arranged vertically between the carrier 102 and the intermetallic mesh structure 108. Moreover, an upper exterior structure 112 is arranged vertically between the intermetallic mesh structure 108 and the component 104. More specifically, the upper exterior structure 112 is directly arranged between the intermetallic mesh structure 108 on a bottom side and the pure backside metallization 120 (made of a homogeneous material) on a top side. As a consequence of the below described manufacturing process, the mesh structure 108 and the exterior structures 110, 112 comprise the same intermetallic materials (in the shown embodiment tin, palladium, gold, silver, nickel, and copper), although in different concentrations along the vertical thickness of the intermetallic connection structure 106.

Advantageously, the intermetallic connection structure 106 comprises a solder matrix 122, which may be provided on the basis of tin, for creating a solder connection between the component 104 and the carrier 102. The solder matrix 122 may have a relatively low melting temperature. In addition, the intermetallic connection structure 106 comprises intermetallic phase promoter particles 124 of one or more intermetallic phase promoter metals being configured for promoting formation of an intermetallic phase within the intermetallic connection structure 106. For instance, silver and/or copper may be used as intermetallic phase promoter metal(s). Descriptively speaking, the intermetallic phase promoter particles 124 may be included in a solder paste (see reference sign 130 in FIG. 4) used as a basis for manufacturing the intermetallic connection structure 106, and may contribute to the formation of the intermetallic mesh, together with particles of the intermetallic phase acceleration layer 128 beneath.

As shown in FIG. 1 as well, the intermetallic connection structure 106 may comprise comprises intermetallic phase acceleration particles 126 of one or more intermetallic phase acceleration metals for accelerating formation of the intermetallic mesh structure 108. Such one or more intermetallic phase acceleration metals may comprise palladium, gold, platinum, and/or zinc. As a source for the intermetallic phase acceleration particles 126, the electronic system 100 comprises an intermetallic phase acceleration layer 128 (of at least one of the mentioned intermetallic phase acceleration metals) for accelerating formation of the intermetallic mesh structure 108 and being arranged between the carrier 102 and the intermetallic connection structure 106. As shown, the intermetallic phase acceleration layer 128 may be a single layer of a homogeneous material located directly beneath the lower exterior structure 110. The intermetallic phase acceleration layer 128, which may also be denoted as dopant layer or protective layer, may comprise one or more materials (such as palladium, gold, zinc, etc.) having a higher melting point than material of the solder matrix 122 (in particular tin) and functioning as a seed or accelerator for the formation of the vertically connecting intermetallic mesh structure 108. The high melting point of the material of the intermetallic phase acceleration layer 128 advantageously suppresses remelting of the intermetallic mesh structure 108 after its formation, even at high reflow temperatures.

Advantageously, the intermetallic connection structure 106 may be free of lead. This renders the materials of the intermetallic connection structure 106 biocompatible and avoids any highly undesired biohazardous properties of the electronic system 100.

Still referring to FIG. 1, a vertical thickness D of the intermetallic connection structure 106 may be preferably in a range from 10 μm to 20 μm, for instance may be 15 μm. Furthermore, a partial vertical thickness of the intermetallic mesh structure 108 divided by the vertical thickness D of the entire intermetallic connection structure 106 may be for example at least 80%, preferably at least 90%. For instance, said partial vertical thickness may be in a range from 8 μm to 16 μm, for instance may be 12 μm.

As shown in FIG. 1, the intermetallic mesh structure 108 forms a bifurcated network of interconnected multi-metal particles extending continuously between an entire vertical spacing between the exterior structures 110, 112. Although the intermetallic mesh structure 108 does not extend entirely straight between the exterior structures 110, 112, it provides for an uninterrupted continuous electrically conductive intermetallic connection between the exterior structures 110, 112. The intermetallic mesh structure 108 is embedded in the solder matrix 122 and may be made of a plurality of different metals, in particular of at least three different metals. The intermetallic mesh structure 108 may be formed by directly connected metallic particles of different chemical elements. Highly advantageously, the presence of the intermetallic mesh structure 108 in the solder matrix 122 prevents an undesired remelting of the intermetallic connection structure 106 as a whole, despite the relatively low melting temperature of tin material of the solder matrix 122. Advantageously, this may be already achieved by a relatively low weight percentage of the partial weight of the intermetallic mesh structure 108 in relation to the weight of the entire intermetallic connection structure 106. For instance, said weight percentage may be in a range from 4.5 weight percent to 6.5 weight percent.

Advantageously, the described intermetallic connection structure may offer a reliable mechanical and electrical connection between the carrier 102 and the component 104 which is properly solderable thanks to the provision of the solder matrix 122 and which is at the same time reliably protected against remelting (in particular at typical reflow temperatures) due to the formation of the intermetallic mesh structure 108. Synergistically, the opposing exterior structures 110, 112 ensure a smooth material transition between the intermetallic mesh structure 108 embedded in the solder matrix 122 on the one hand and the intermetallic phase acceleration layer 128 as well as the backside metallization 120 on the other hand. The intermetallic connection structure 106 shows a high mechanical and thermal robustness and therefore results in a higher reliability of the manufactured electronic system 100. It neither harms a user in view of its material composition, nor is there a risk of remelting during reflow. Consequently, the electronic system 100 provides a high thermal, mechanical and electrical performance.

FIG. 2 to FIG. 8 are cross-sectional views of structures obtained during manufacturing an electronic system 100, such as the one shown in FIG. 1, according to an exemplary embodiment.

Referring to FIG. 2, carrier 102 is shown being covered with intermetallic phase acceleration layer 128 for later accelerating formation of the intermetallic mesh structure 108. As described above, the carrier 102 can be formed of a base or main body 114 of copper covered with a metallic diffusion barrier 116 of nickel. Metal diffusion barrier 116 may prevent diffusion of material of main body 114 in an upward direction. The intermetallic phase acceleration layer 128 may be a plated dopant layer, which may be made of palladium and gold. For example, a thickness b of the intermetallic phase acceleration layer 128 may be in a range from 0.05 μm to 1 μm, for instance 0.1 μm. Hence, the intermetallic phase acceleration layer 128 is a single layer according to FIG. 2. More generally, possible plating dopants for forming the intermetallic phase acceleration layer 128 are palladium, gold, platinum and zinc.

Referring to FIG. 3, a layer sequence being alternative to the one of FIG. 2 is shown. According to FIG. 3, the carrier 102 is covered with an intermetallic phase acceleration layer 128 configured as a double layer. In the shown example, a bottom layer 128A (also denoted as dopant layer) formed on the carrier 102 comprises zinc, whereas a top layer 128B (also denoted as combined dopant and protective layer) formed on bottom layer 128A may for instance comprise palladium and gold.

As already mentioned, FIG. 2 and FIG. 3 show two examples of a carrier 102 with dopants plating in form of intermetallic phase acceleration layer 128 which may be constituted as single layer or multi-layer. The following process will be explained on the basis of the structure shown in FIG. 2, wherein a corresponding process can be carried out based on the structure shown in FIG. 3.

Referring to FIG. 4, a solder paste 130 may be applied on the carrier 102 which is covered with the intermetallic phase acceleration layer 128. As shown, the solder paste 130 comprises intermetallic particles 132 comprising a solder matrix 122 (preferably made of tin) for creating a solder connection between the component 104 and the carrier 102. Furthermore, the intermetallic particles 132 comprise intermetallic phase promoter particles 124 in the solder matrix 122. The latter may be made of one or more intermetallic phase promoter metals for promoting formation of an intermetallic phase within the intermetallic connection structure 106. In the shown embodiment, the intermetallic phase promoter particles 124 comprise a first type of particles and a second type of particles. For instance, the first type of particles may be made of silver, whereas the second type of particles may be made of copper.

Hence, after plating the carrier 102 with the intermetallic phase acceleration layer 128 for accelerating formation of the intermetallic mesh structure 108, the intermetallic phase acceleration layer 128 may be covered with the solder paste 130.

Although not shown in FIG. 2 to FIG. 8, it may be possible, additionally or alternatively to the provision of a planar intermetallic phase acceleration layer 128, to provide intermetallic phase acceleration particles 126 (see FIG. 1) in the solder paste 130 for accelerating formation of the intermetallic mesh structure 108. This may avoid the need to plate a dedicated intermetallic phase acceleration layer 128 on the carrier 102.

It should be appreciated that the shown process of solder printing is not limited to a certain solder type, but depends on a final solder joint requirement. Thus, many different solder systems may be implemented in different embodiments. For instance, an appropriate solder paste 130 may contain mainly Sn and one or more other metallic elements in smaller amounts. For example, 3 weight percent silver, and 0.5 weight percent Cu may be added to the Sn matrix in a solder paste 130 used in an exemplary embodiment. Also flux, additives, etc. may be added to the solder paste 130.

Referring to FIG. 5, electronic component 104, composed of a semiconductor body 118 and a back side metallization 120, may be pressed from a top side on the applied solder paste 130. Consequently, the solder paste 130 is pressed between the carrier 102 and the component 104 and forms a layer of substantially homogeneous thickness. Advantageously, the intermetallic particles 132 of the solder paste 130 may be planarized by the mechanical pressure exerted between the carrier 102 and the component 104 to thereby form a monolayer 134 of solderable intermetallic particles 132 (optionally in a matrix of solvent(s), not shown). The intermetallic particles 132 of the solder paste 130 may have a diameter d preferably in a range from 10 μm to 20 μm, for example 15 μm. During die bonding, the solder layer may thus be pressed down to monolayer 134 which enables a controlled definition of bond line thickness. Bond line thickness may describe the thickness of solderable material between carrier 102 and component 104. During the described process, it is possible to provide additional dopants from the back side of the die, such as Cu, Au, Pd, and/or V.

Referring to FIG. 6, a process of interconnecting the electrically conductive carrier 102 with the electronic component 104 by an intermetallic connection structure 106 is started. More specifically, formation of the intermetallic connection structure 106 is triggered by heating precursors of the intermetallic connection structure 106 up to a peak temperature above a melting temperature of solder matrix 122 as solder precursor and below a melting temperature of intermetallic mesh precursors, which may here be embodied as the intermetallic phase promoter particles 124, as well as the materials of layer(s) 128 and/or 120. Descriptively speaking, the structure of FIG. 5 is heated for melting solder matrix 122 without melting the material according to reference signs 120, 124, and/or 128. Advantageously, a maximum or peak temperature, which may be preferably in a range from 280° C. to 300° C., during this selective melting process may be maintained for a time interval in a range from preferably 1.5 minutes to 2 minutes. For instance, the melting temperature of the solder precursor in form of solder matrix 122 is below: 240° C. (for instance, a melting point of tin may be about 230° C.). In contrast to this, the melting temperature of the mentioned intermetallic mesh precursors may be significantly above 300° C.

In particular, the described process may form the intermetallic connection structure 106 by reflow soldering. During said reflow soldering, the material of the solder matrix 122 reaching and exceeds its melting point and becomes liquid, whereas constituents of the intermetallic mesh structure 106 being formed may remain solid.

Figures 7, 8, 9, 10:
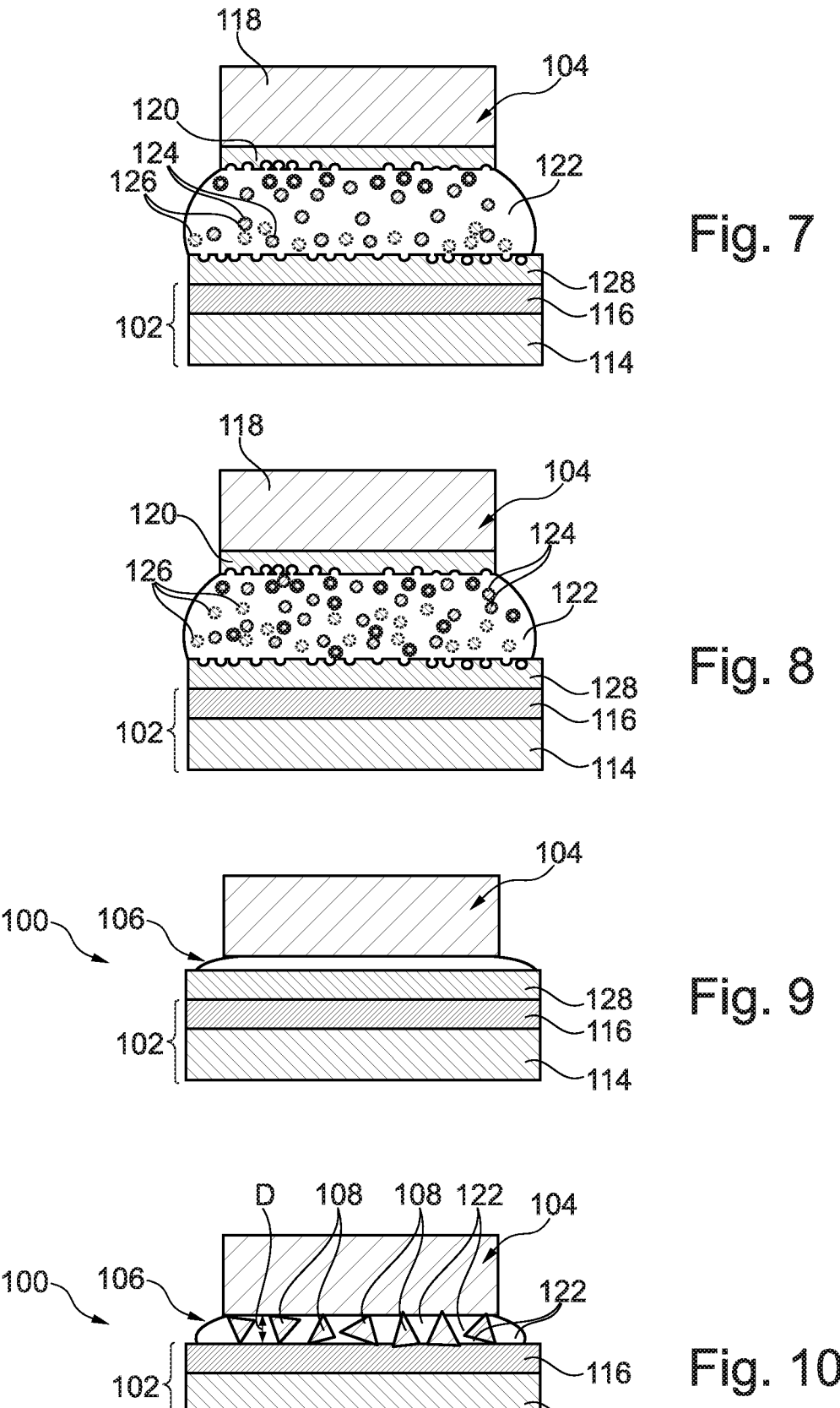

Referring to FIG. 7, when the material of the solder matrix 122 becomes liquid, the dopants become solutes (descriptively speaking, an element concentration difference drives the diffusion process) and dissolves into the liquid bulk solder. In addition to the intermetallic phase promoter particles 124, intermetallic phase acceleration particles 126 may be separated from the intermetallic phase acceleration layer 128. Moreover, additional particles may be separated from the backside metallization 120 and may dissolve into the liquid solder matrix 122.

Referring to FIG. 8, formation of the intermetallic connection structure 106 continues by dissolving additional particles in the liquid solder matrix 122. As a result, an intermetallic connection structure 106 according to FIG. 1 may be obtained. Such an intermetallic connection structure 106 may comprise an intermetallic mesh structure 108 in a central portion, and opposing exterior structures 110, 112 without intermetallic mesh and each arranged between, on the one hand, the intermetallic mesh structure 108 and, on the other hand, the carrier 102 or the component 104. As a consequence of the described manufacturing method, the mesh structure 108 and the exterior structures 110, 112 comprise the same intermetallic materials, i.e. tin, copper, gold, silver, palladium, zinc, etc., in particular depending on the materials used for solder paste 130, intermetallic phase acceleration layer 128, and backside metallization 120. Also a certain contribution of material(s) of the carrier 102 may be included in the intermetallic connection structure 106.

For the described manufacturing process, a dopant system may be used which combines paste and plating. Since solder paste 130 may be printed to a plated surface and a reflow process may be carried out, the plated element on the carrier 102 can be a dopant, for instance comprising Pd and Au. Besides the freedom to choose different materials for the solder paste 130 (such as SAC305, SAC405 or a Ni dopant paste, etc.), for different mission profile or reliability needs, other elements may be possible, for instance Zn. Advantageously, dopants from the carrier 102 do not impact workability of the solder paste 130 (for instance in terms of flowability, wetting, melting point, etc.). Involved elements may continue to diffuse, thereby rendering the bulk solder a more homogenous solution. The dispersed dopants may function as a seed for the creation of the intermetallic compound mesh or intermetallic mesh structure 108.

Again referring to the embodiments of FIG. 1 to FIG. 8, when the reaction energy is provided (during a reflow profile peak temperature and holding time), dopant (in particular from the structures shown with reference signs 124, 128) starts to form an intermetallic compound with Sn from solder matrix 122, thereby creating intermetallic mesh structure 108. Also along the carrier 102 and the component 104 (in particular at chip backside contact interface according to reference sign 120), a strong connection may be created in form of exterior structures 110, 112.

Advantageously, the intermetallic mesh structure 108 or intermetallic compound mesh is not remelting in a normal reflow profile (for instance with a peak temperature of about 260° C.). Descriptively speaking, intermetallic mesh structure 108 forms a backbone of a created bond line from any movement during further movement. It may be possible that the intermetallic mesh structure 108 or intermetallic compound mesh is created on atomic level of dopants which can be more homogenous and faster (due to a bigger surface area or reaction sites), in comparison to the use of a metal powder. Material of solder matrix 122 (in particular Sn) gets pulled in to form an intermetallic compound surrounding the dopants. This may leave behind pure Sn (such as not-reacted Sn), wherein Sn enrichment may be observed generally in the bulk solder. Conventionally, tin may be a main cause of undesired remelting, since other elements are high or higher temperature melting elements. Such undesired remelting phenomena may be reliably suppressed in particular by the intermetallic mesh structure 108.

As already mentioned above, a low bond line thickness may be obtained. Consequently, a short time may be sufficient for rendering the bulk solder homogeneous with dopants. This may be advantageous to enable formation of the intermetallic compound mesh or intermetallic mesh structure 108 which connect upper and lower contact interfaces in form of the opposing exterior structures 110, 112 (i.e. at die back side, and carrier surface). Advantageously, Sn binding may occur in the intermetallic compound (promoting the tendency of the intermetallic connection structure 106 of not remelting) which may also play a role in terms of binding the intermetallic compound mesh.

FIG. 9 illustrates a cross-sectional view of an electronic system 100 according to another exemplary embodiment. According to FIG. 9, the vertical thickness of the intermetallic connection structure 106 is very small. In the embodiment of FIG. 9, main body 114 is made of copper, barrier layer 116 is made of nickel, and the intermetallic phase acceleration layer 128 comprises palladium and gold as dopants.

Table 1 shows a metallic content of various constituents of an intermetallic connection structure 106 according to FIG. 9. Table 2 summarizes information from Table 1 and provides an indication about a ratio between a partial weight of dopants and a total weight of the intermetallic connection structure 106 according to Table 1.

TABLE 1

| Material | Total mass [g] |
| --- | --- |
| Gold | $1.158 \ 10^{-12}$ |
| Palladium | $9.6 \ 10^{-13}$ |
| Solder (altogether) | $1.01115 \ 10^{-10}$ |
| Tin (96% of solder paste) | $9.70704 \ 10^{-11}$ |
| Silver (3% of solder paste) | $3.03345 \ 10^{-12}$ |
| Copper (0.5% of solder paste) | $5.05575 \ 10^{-13}$ |

TABLE 2

| | |
| --- | --- |
| Dopants mass in total (in [g]) | $5.65703 \ 10^{-12}$ |
| Solder joint mass in total (in [g]) | $1.03233 \ 10^{-10}$ |
| Dopants mass/Solder joint mass [%] | 5.48 |

Hence, Table 1 and Table 2 indicate a weight ratio of dopants in the solder joint of an intermetallic compound mesh. As shown, omitting dopants from the chip back side, the dopants weight ratio over the whole solder joint is about 5.5% in the shown embodiment.

An increase of loading dopants may speed up the intermetallic compound mesh formation. However, when this speed is to too fast, this may result in a discharge of flux from the bond line (so that the flowability of the solder material will be reduced). This may create voids in the bond line. An optimization may be carried out based on (i) reflow profile, and (ii) dopants amount. Generally, a dopant amount may be in a range of 1 weight percent to 35 weight percent, and in many scenarios excellent results may be achieved in a range from 4.5 weight percent to 6.5 weight percent.

In an embodiment, a manufacturing method may comprise generating the intermetallic connection structure 106 with the intermetallic mesh structure 108 out of a composition of tin (Sn) alloyed with copper (Cu) and silver (Ag), with copper in a range from 1 weight percent to 30 weight percent, silver in a range from 1 weight percent to 60 weight percent, and preferably the rest tin. Thus, the intermetallic mesh structure 108 may be generated out of compositions of Sn alloyed with Cu and Ag in the ranges of Cu from 1 weight percent until 30 weight percent and Ag from 1 weight percent until 60 weight percent (i.e. using a Ag—Cu—Sn solder system).

Table 3 shows exemplary compositions of an intermetallic connection structure 106 with intermetallic mesh structure 108 according to embodiments (together with solidus temperature, $T_{solidus}$, and liquidus temperature, $T_{liquidus}$):

TABLE 3

| Composition (at %/wt %) | $T_{solidus}$ [° C.] | $T_{liquidus}$ [° C.] |
| --- | --- | --- |
| 30, 3Ag-24, 1Cu-45, 6Sn 32Ag-15Cu-53Sn | 216 | 448 |
| 52, 2Ag-19, 3Cu-28, 5Sn 55Ag-12Cu-33Sn | 214 | 477 |
| 30, 5Ag-10, 4Cu-59, 1 Sn 30Ag-6Cu-64Sn | 216 | 400 |
| 42, 1 Ag-23, 8Cu-34, 1Sn 45Ag-15Cu-40Sn | 216 | 506 |

FIG. 10 illustrates a cross-sectional view of an electronic system 100 according to still another exemplary embodiment. In the embodiment according to FIG. 10, formation of a metallic mesh structures 108 in a solder matrix 122 extending over almost the entire extension between carrier 102 and component 104 is shown. Hence, the relative vertical extensions of the exterior structures 110, 112 (not shown in FIG. 10) may be very low.

Figures 11, 12, 13, 14, 15:
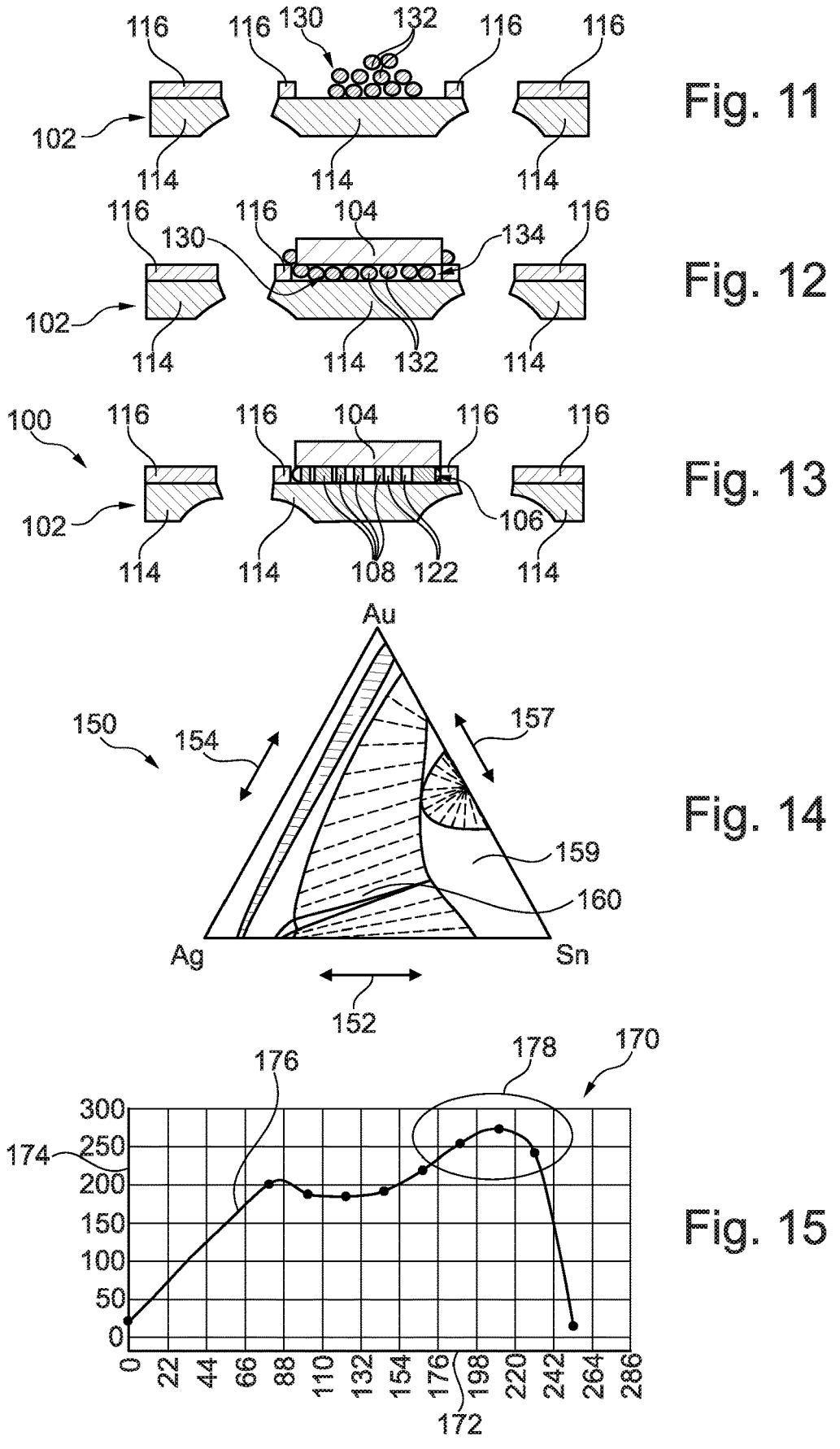
FIG. 11 to FIG. 13 are cross-sectional views of structures obtained during manufacturing an electronic system according to yet another exemplary embodiment.
FIG. 14 is a phase diagram illustrating properties of different intermetallic phases created by mixing silver, gold and tin and serves for explaining a principle of an exemplary embodiment.
FIG. 15 is a diagram illustrating a reflow soldering process carried out during manufacturing an electronic system according to an exemplary embodiment.

FIG. 11 to FIG. 13 are cross-sectional views of structures obtained during manufacturing an electronic system 100 according to yet another exemplary embodiment.

Referring to FIG. 11, a solder paste 130 comprising intermetallic particles 132 is applied to an upper main surface of a leadframe-type carrier 102. Thus, the leadframe may be subjected to smart selective soldering. For instance, a corresponding process may be carried out with defined pad line in laminates. Again referring to FIG. 11, it may be possible to dispense the solder paste 130 in very small amount. For instance, it may be possible to use fine solder paste 130, for instance type 5 solder paste.

Referring to FIG. 12, the electronic component 104 is pressed from above onto the applied solder paste 130. Thus, a die bonding process may be executed, and the electronic component 104 may be pressed onto the solder paste 140 so that a thickness of the deformed solder paste 130 is reduced to preferably one solder ball size. In other words, a monolayer 134 of intermetallic particles 132 is formed between the carrier 102 and the component 104 by pressing.

Referring to FIG. 13, the structure shown in FIG. 12 is subjected to reflow soldering, to thereby form an intermetallic connection structure 106 between carrier 102 and component 104, as described above. Thus, a reflow process is carried out to allow high intermetallic compound formation (for instance, a target may be 70%).

FIG. 14 is a phase diagram 150 illustrating properties of different intermetallic phases created by mixing silver, gold and tin and serves for explaining a principle of an exemplary embodiment.

A variation of the mole fraction between silver (Ag) and tin (Sn) is shown with reference sign 152. Correspondingly, a variation of the mole fraction between silver (Ag) and gold (Au) is shown with reference sign 154. Furthermore, a variation of the mole fraction between tin (Sn) and gold (Au) is shown with reference sign 157. The phase diagram 150 shows various phases of the gold-silver-tin system. For instance, a liquid phase may be obtained in a region 159 with high tin content. In a central region of the phase diagram 150 corresponding to reference sign 160, a high mix of multiple metallic elements may be achieved. Said region may be used for forming the intermetallic mesh structure 108 according to an exemplary embodiment.

More specifically, an exemplary embodiment may use multiple metallic elements to generate a vertically fused intermetallic compound (or a plurality of intermetallic compounds). This may allow to create an intermetallic compound mesh or intermetallic mesh structure 108 after a reflow process. Advantageously, the intermetallic compound mesh is not remelting during further reflows. Thus, it may be possible to maintain a structural stability of the obtained bond line or intermetallic connection structure 106. Descriptively speaking, the intermetallic connection structure 106 may hold electronic components 104 (in particular silicon chips) to the carrier 102 during reflow. Advantageously, bulk solder clusters may melt during reflow, but cannot flow away due to its embedding in the intermetallic compound mesh. Advantageously, bulk solder (which may be soft and ductile) can balance stress in the bond line.

FIG. 15 is a diagram 170 illustrating a reflow soldering process carried out during manufacturing an electronic system 100 according to an exemplary embodiment. Along an abscissa 172, time is plotted in seconds. Along an ordinate 174, a temperature is plotted in ° C. A curve 176 illustrates a high-temperature reflow profile. As indicated with reference sign 178, the peak temperature (which may be selected in a range from 280° C. to 300° C., for instance higher and below a carrier Tg) is held during reflow soldering for a relatively long time in the range from preferably 1 minute to 2 minutes. With this control regime, excellent properties in terms of formation of an intermetallic mesh structure 108 in intermetallic connection structure 106 can be obtained.

Figure 16:
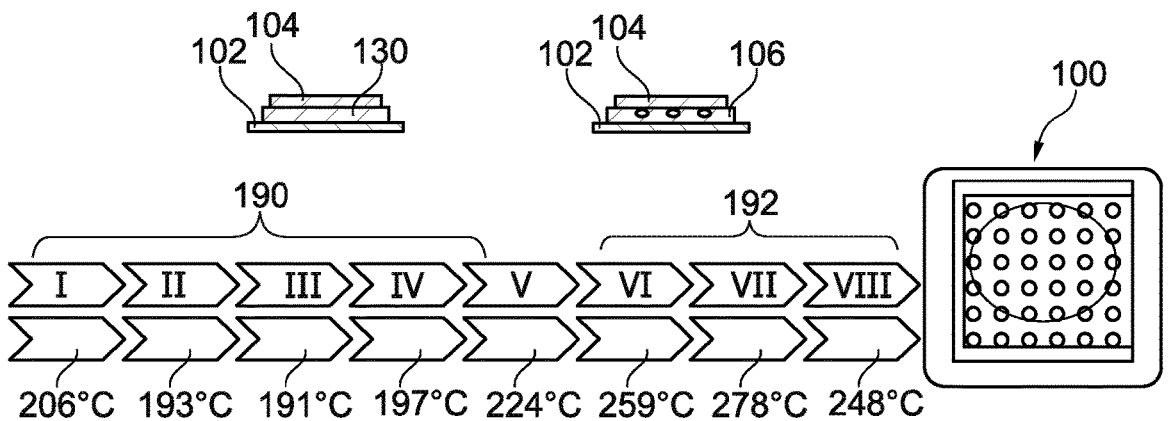
FIG. 16 and FIG. 17 illustrate a method of manufacturing an electronic system according to an exemplary embodiment.
Figure 17:
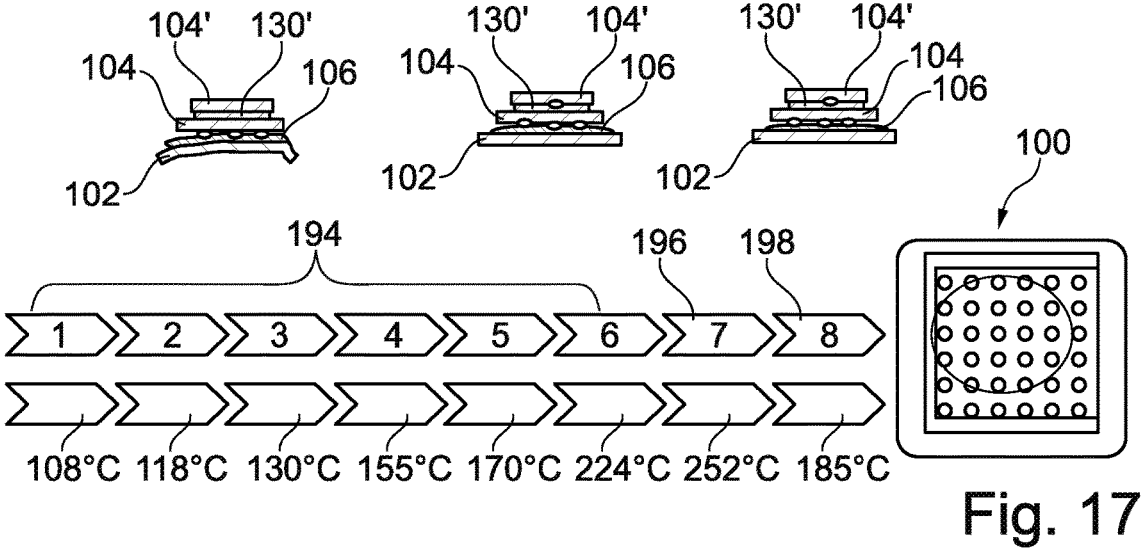

FIG. 16 (first reflow) and FIG. 17 (second reflow) illustrate a method of manufacturing an electronic system 100 according to an exemplary embodiment. The described reflow profile may reliably prevent an undesired remelting of solder material. During the described reflow soldering process, a preform of the electronic system 100 to be formed is guided through temperature zones I to VIII with different temperature values, as indicated in FIG. 16. Referring to reference sign 190, the preform may be guided through a soak zone in which a solder joint is not yet formed. As shown by reference sign 192, the preform may then be subjected to an increased peak time and temperature, which facilitates intermetallic compound growth.

Thereafter, the processed preform of the electronic system 100 to be formed may be subjected to a further reflow process. In this context, the preform may be guided through temperature zones 1 to 8 with different temperature values, as indicated in FIG. 17. According to FIG. 17, a further electronic component 104' is connected above electronic component 104 by additional solder paste 130'. Also in the process according to FIG. 17, no solder remelting for the first component 104 occurs in the temperature peak zone.

In a soak zone 194, a solder joint is not yet formed. In a peak zone 196, the solder melts. In a cool zone 198, the solder solidifies.

Figure 18:
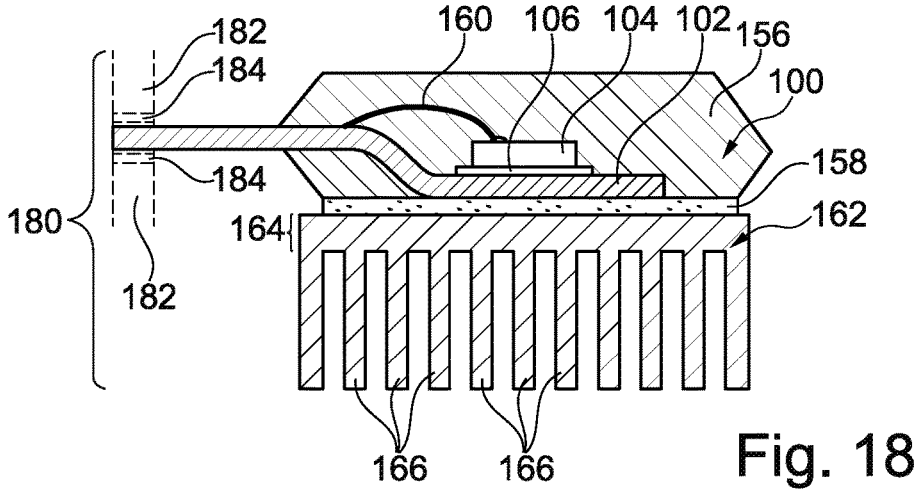
FIG. 18 illustrates a cross-sectional view of an electronic system according to still another exemplary embodiment.

FIG. 18 illustrates a cross-sectional view of an electronic system 100, which is embodied as a Transistor Outline (TO) package, according to an exemplary embodiment. The electronic system 100 is mounted on a mounting structure 182, here embodied as printed circuit board, for establishing an arrangement 180.

The mounting structure 182 comprises an electric contact 184 embodied as a plating in a through hole of the mounting structure 182. When the electronic system 100 is mounted on the mounting structure 182, an electronic component 104 of the electronic system 100 is electrically connected to the electric contact 184 via an electrically conductive carrier 102, here embodied as a leadframe made of copper, of the electronic system 100.

The electronic system 100 thus comprises the electrically conductive carrier 102, the electronic component 104 (which is here embodied as a power semiconductor chip) mounted on the carrier 102 by intermetallic connection structure 106, and an encapsulant 156 encapsulating part of the carrier 102 and the electronic component 104. As can be taken from FIG. 18, a pad on an upper main surface of the electronic component 104 is electrically coupled to the carrier 102 via a bond wire as electrically conductive contact element 160.

During operation of the power electronic system or electronic system 100, the power semiconductor chip in form of the electronic component 104 generates a considerable amount of heat. At the same time, it shall be ensured that any undesired current flow between a bottom surface of the electronic system 100 and an environment is reliably avoided.

For ensuring electrical insulation of the electronic component 104 and removing heat from an interior of the electronic component 104 towards an environment, an electrically insulating and thermally conductive interface structure 158 may be provided which covers an exposed surface portion of the carrier 102 and a connected surface portion of the encapsulant 156 at the bottom of the electronic system 100. The electrically insulating property of the interface structure 108 prevents undesired current flow even in the presence of high voltages between an interior and an exterior of the electronic system 100. The thermally conductive property of the interface structure 158 promotes a removal of heat from the electronic component 104, via the electrically conductive carrier 102 (of thermally properly conductive copper), through the interface structure 108 and towards a heat dissipation body 162. The heat dissipation body 162, which may be made of a highly thermally conductive material such as copper or aluminum, has a base body 164 directly connected to the interface structure 158 and has a plurality of cooling fins 166 extending from the base body 164 and in parallel to one another so as to remove the heat towards the environment.

As shown as well in FIG. 18, intermetallic connection structure 106 is formed between carrier 102 and component 104, for instance embodied as shown in FIG. 1.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic system, wherein the electronic system comprises:
an at least partially electrically conductive carrier;
an electronic component; and
an intermetallic connection structure connecting the carrier and the component and comprising:
an intermetallic mesh structure comprising a plurality of interconnected filaments each formed by a sequence of directly connected metallic particles of at least three different metallic chemical elements in a central portion of the intermetallic connection structure;
a metallic matrix of another metallic material different from the at least three different metallic chemical elements; and
opposing exterior structures without intermetallic mesh and each arranged between the intermetallic mesh structure and the carrier and the electronic component, the filaments embedded within the metallic matrix and forming continuously electrically conductive vertical paths between the opposing exterior structures to electrically connect the electronic component to the carrier.

2. The electronic system according to claim 1, wherein the carrier comprises a leadframe structure.

3. The electronic system according to claim 1, wherein the carrier comprises an electrically conductive main body which is partially covered by a metallic diffusion barrier.

4. The electronic system according to claim 1, wherein the component comprises a semiconductor body covered with a backside metallization, said backside metallization being connected to the intermetallic connection structure.

5. The electronic system according to claim 1, wherein the metallic matrix of the intermetallic connection structure comprises a solder matrix for creating a solder connection between the component and the carrier.

6. The electronic system according to claim 5, wherein the solder matrix comprises tin.

7. The electronic system according to claim 1, wherein the intermetallic connection structure comprises intermetallic phase promoter particles of at least one intermetallic phase promoter metal for promoting formation of an intermetallic phase within the intermetallic connection structure.

8. The electronic system according to claim 7, wherein the at least one intermetallic phase promoter metal comprises at least one of a group consisting of silver and copper.

9. The electronic system according to claim 1, wherein the mesh structure and the exterior structures comprise the same intermetallic materials.

10. The electronic system according to claim 1, wherein the intermetallic connection structure comprises intermetallic phase acceleration particles of at least one intermetallic phase acceleration metal for accelerating formation of the intermetallic mesh structure, wherein in particular the at least one intermetallic phase acceleration metal comprises at least one of a group consisting of palladium, gold, platinum, vanadium and zinc.

11. The electronic system according to claim 1, wherein the intermetallic connection structure is free of lead.

12. The electronic system according to claim 1, wherein a vertical thickness of the intermetallic connection structure is in a range from 5 μm to 50 μm.

13. The electronic system according to claim 1, comprising an intermetallic phase acceleration layer of at least one intermetallic phase acceleration metal for accelerating formation of the intermetallic mesh structure and being arranged between the carrier and the intermetallic connection structure, wherein in particular the intermetallic phase acceleration layer is a single layer or a double layer.

14. The electronic system according to claim 1, wherein a partial vertical thickness of the intermetallic mesh structure in relation to an entire vertical thickness of the entire intermetallic connection structure is at least 80%.

15. The electronic system according to claim 1, wherein the intermetallic mesh structure forms a bifurcated network of interconnected multi-metal particles extending continuously between an entire vertical spacing between the exterior structures.

16. The electronic system according to claim 1, wherein a weight percentage of the intermetallic mesh structure in relation to the entire intermetallic connection structure is in a range from 1 weight percent to 30 weight percent.

17. The electronic system according to claim 1, wherein the intermetallic connection structure with the intermetallic mesh structure comprises a composition of tin alloyed with copper and silver, with copper in a range from 1 weight percent to 30 weight percent, silver in a range from 1 weight percent to 60 weight percent, and preferably the rest tin.

18. The electronic system according to claim 1, wherein the intermetallic connection structure comprises intermetallic phase acceleration particles of at least one intermetallic phase acceleration metal for accelerating formation of the intermetallic mesh structure, wherein in particular the at least one intermetallic phase acceleration metal comprises at least one of a group consisting of palladium, platinum, vanadium and zinc.

* * * * *